United States Patent
Jhon et al.

(10) Patent No.: US 8,741,745 B2
(45) Date of Patent: Jun. 3, 2014

(54) METHOD OF CONTROLLING AMOUNT OF ADSORBED CARBON NANOTUBES AND METHOD OF FABRICATING CARBON NANOTUBE DEVICE

(75) Inventors: Young Min Jhon, Seoul (KR); Young Tae Byun, Guri-Si (KR); Chi Woong Jang, Yongin-Si (KR); Kyeong Heon Kim, Seoul (KR); Seok Lee, Seoul (KR); Deok Ha Woo, Seoul (KR); Sun Ho Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 147 days.

(21) Appl. No.: 13/307,438

(22) Filed: Nov. 30, 2011

(65) Prior Publication Data

US 2012/0289029 A1    Nov. 15, 2012

(30) Foreign Application Priority Data

May 12, 2011    (KR) ........................ 10-2011-0044490

(51) Int. Cl.
*H01L 21/20*    (2006.01)
*B82Y 40/00*    (2011.01)

(52) U.S. Cl.
USPC ....... 438/478; 257/E21.09; 977/742; 977/842

(58) Field of Classification Search
USPC .............. 257/E21.09; 438/478; 977/742, 842
See application file for complete search history.

(56) References Cited

U.S. PATENT DOCUMENTS

| 2003/0080663 A1* | 5/2003 | Ito .................................. 313/336 |
| 2003/0102797 A1* | 6/2003 | Kajiwara ....................... 313/486 |
| 2008/0044775 A1* | 2/2008 | Hong et al. .................... 430/323 |

FOREIGN PATENT DOCUMENTS

| KR | 10-2010-0125068 A | 11/2010 |
| KR | 10-2011-0032466 A | 3/2011 |
| KR | 10-2011-0044360 A | 4/2011 |

OTHER PUBLICATIONS

Chang, Yu Jin, et al., "Percolation network of growing $V_2O_5$ nanowires," Applied Physics Letters, Jun. 28, 2004, pp. 5392-5394, vol. 84, No. 26, (American Institute of Physics).
Coffey, David C., et al., "JACS Communications: Patterning Phase Separation in Polymer Films with Dip-Pen Nanolithography," J. Am. Chem. Soc., Mar. 12, 2005, pp. 4564-4565, vol. 127, No. 13 (American Chemical Society).
Kaempgen, M., et al., "Transparent carbon nanotube coatings," Applied Surface Science, 2005, pp. 425-429, vol. 252 (Elsevier B.V.).
Lee, M., et al., "Articles: Linker-free directed assembly of high-performance integrated devices based on nanotubes and nanowires," Nature Nanotechnology, Oct. 4, 2006, pp. 66-71, vol. 1, (Nature Publishing Group).
Ng, Andrew M H, et al., "Efficient coating of transparent and conductive carbon nanotube thin films on plastic substrates," Nanotechnology, Apr. 15, 2008, pp. 1-5, (IOP Publishing).

(Continued)

*Primary Examiner* — Peniel M Gumedzoe
(74) *Attorney, Agent, or Firm* — NSIP Law

(57) ABSTRACT

Provided are a method of controlling an amount of adsorbed carbon nanotubes (CNTs) and a method of fabricating a CNT device. The method of controlling an amount of adsorbed CNTs includes adsorbing CNT particles onto a semiconductor structure, and removing some of the adsorbed CNTs by performing an oxygen plasma treatment on the adsorbed CNT particles.

12 Claims, 4 Drawing Sheets

(56) References Cited

OTHER PUBLICATIONS

Snow, E.S., et al., "Random networks of carbon nanotubes as an electronic material," Applied Physics Letters, Mar. 31, 2003, pp. 2145-2147, vol. 82, No. 13.

Korean Office Action issued on Mar. 5, 2013 in counterpart Korean Patent Application No. 10-2011-0044490. (6 pages including partial English translation).

* cited by examiner

METHOD OF CONTROLLING AMOUNT OF ADSORBED CARBON NANOTUBES AND METHOD OF FABRICATING CARBON NANOTUBE DEVICE

CROSS-REFERENCE TO RELATED APPLICATION

This application claims priority to and the benefit of Korean Patent Application No. 2011-0044490, filed on May 12, 2011, the disclosure of which is incorporated herein by reference in its entirety.

BACKGROUND

1. Field of the Invention

The present invention relates to a method of controlling an amount of adsorbed carbon nanotubes (CNTs) and a method of fabricating a CNT device and, more particularly, to a method of uniformly controlling an amount of CNTs in each CNT device by adsorbing CNTs and then removing a required amount of the adsorbed CNTs.

2. Discussion of Related Art

The most interesting electrical property of nanomaterials such as CNTs, in particular, CNTs, is a higher electron mobility than that of single crystal silicon at room temperature. Due to this property, CNT have high applicability to electronic devices such as a field effect transistor (FET), and due to a high ratio of surface area to volume, have very high applicability to chemical sensors and biosensors. However, absence of mass fabrication techniques for manufacturing a structure in which a specific amount of CNTs is arranged in a specific direction at a specific position is currently the largest obstacle to commercializing CNT devices. Also, to fabricate a thin film transistor (TFT) or FET on various substrate materials without exposing a device substrate to a high-temperature process, solution processing techniques for adsorbing grown CNTs onto a substrate need to be further developed instead of existing chemical vapor deposition growth methods.

To solve these problems, research has been carried out on an FET device that utilizes a random CNT network as a channel as disclosed in Reference 1 below.

Reference 1

E. S. Snow, J. P. Novak, P. M. Campbell, and D. Park, "Random networks of carbon nanotubes as an electronic material," Appl. Phys. Lett., Vol. 82, No. 13, pp. 2145 (2003).

In a method of <Reference 1> for fabricating an FET device that utilizes a random CNT network as a channel, CNTs are grown on a thermal oxide layer that has been grown on a silicon wafer and has a thickness of 250 nm, and a source-drain electrode is fabricated using photolithography and lift off techniques. Here, the CNTs are grown at 700° C., which is not a low-temperature process.

Meanwhile, a nanomaterial assembly pattern fabricated with a line width of 3 to 4 μm has been recently disclosed in Reference 2 below as a large nanomaterial pattern fabricated by photolithography and the self-assembly of CNTs.

Reference 2

M. Lee, J. Im, B. Y. Lee, S. Myung, J. Kang, L. Huang, Y.-K. Kwon & S. Hong, "Linker-free directed assembly of high-performance integrated devices based on nanotubes and nanowires" Nanotechnology, Vol. 1, p. 66 (2006).

In the method, a photoresist (PR) pattern is formed on a silicon substrate having a thermal oxide layer using photolithography. The resultant substrate is immersed in an anhydrous hexane solution to remove water, and then is immersed in an octadecyltrichlorosilane (OTS) solution, so that an OTS self-assembled monolayer (SAM) layer is selectively formed in an area having no PR pattern. Finally, PR is removed with acetone, so that a high-quality OTS SAM layer is formed. This fabrication process is a low-temperature process and utilizes an existing semiconductor process, thus enabling mass production. However, OTS used in the solution process is unstable, thus deteriorating reliability of a formed thin layer. For this reason, a new OTS solution needs to be prepared every time self-assembly is performed, and an OTS thin layer needs to be adsorbed and then discarded at a specific constant temperature and humidity. In other words, conditions for an OTS process are very strict, and high cost is needed because it is impossible to use the same OTS solution twice or more. Also, since OTS reacts with moisture and explodes, it needs to be diluted with anhydrous hexane for use and then discarded by a waste disposal company. These problems need to be solved to enable mass production of nanosensors having a large area at a low cost.

In addition to this method, dip-pen nanolithography (DPN) (see <Reference 3> below), microcontact printing (μCP) (see <Reference 4> below), etc. can be used to form an OTS SAM pattern,

Reference 3

D. C. Coffey, D. S. Ginger, J. Am. Chem. Soc., 127, 4564 (2005).

Reference 4

Y. j. Chang, B. H. Kang, G. T. Kim, S. J. Park, J. S. Ha, Appl. Phys. Lett., 84, 5392 (2004).

Meanwhile, since OTS is greatly affected by process temperature and process moisture, a process environment needs to be constantly maintained, and in order to uniformly maintain a state of an OTS solution mixed with anhydrous hexane, a new OTS solution needs to be prepared every time a process is performed. To solve these problems, a new process of fabricating a CNT pattern without using an OTS solution involving complex process conditions (temperature, humidity, a SAM solution, etc.) is required.

To satisfy this requirement, a new process has been disclosed in Laid-down Korean Patent Application "Selective assembled method of nanomaterials by using only photolithography and fabrication method of nanostructure multichannel FET devices using thereof" filed by the present applicant on Sep. 23, 2009.

Meanwhile, electrical characteristics of a CNT electronic device fabricated using CNTs vary according to the amount of CNT particles. Specifically, conductivity increases when a large amount of CNTs are present, and decreases when a small amount of CNTs are present. Thus, to fabricate a reliable CNT electronic device, a means for properly controlling the amount of CNT particles is needed.

This necessity has resulted in a method of immersing a substrate in a solution containing CNT particles and controlling the amount of adsorption by adjusting time. An example of this method is disclosed in Nanotechnology, 19 (2008) p 205703, and so on. In this method, the amount of adhering CNTs varies according to a mixing ratio of CNT particles and a mixture solution, a dispersion time, a dipping time, and $SiO_2$ surface characteristics, and it is difficult to fabricate a device due to these variables.

There is another method of spraying a solution containing CNT particles onto a substrate (Applied Surface Science 252 (2005) p. 425). In this method, it is difficult to fabricate a reproducible device due to variables such as a CNT spray pressure, a ratio of a CNT mixture solution, and amount of spray/area.

Consequently, devices to which CNTs are applied are still in need of a method of efficiently controlling the amount of CNT particles. In such a method, the yield of CNT devices can be increased by uniformizing electrical characteristics of the CNT devices.

SUMMARY OF THE INVENTION

The present invention is directed to providing a method of uniformly controlling an amount of CNTs in each CNT device by adsorbing CNTs and then removing a required amount of the adsorbed CNTs.

According to an aspect of the present invention, there is provided a method of controlling an amount of CNTs in a CNT device. The method includes: adsorbing CNT particles onto a semiconductor structure; and removing adsorbed CNTs by performing an oxygen plasma treatment on the adsorbed CNT particles.

The term "semiconductor structure" refers to an intermediate required to fabricate the above-mentioned CNT device, and denotes a structure that may include various buffer layers as well as a substrate and also includes a variety of insulating layers, electrode layers, etc. as necessary.

The term "CNT device" denotes all devices that are fabricated using CNTs as an active layer, and can be various chemical sensors, field effect transistors (FETs), thin film transistors (TFTs), and so on.

Preferably, adsorbing the CNT particles onto the semiconductor structure may include immersing a substrate on which a photoresist (PR) pattern has been formed in a solution of dichlorobenzene in which CNTs are dispersed for a predetermined time (e.g., several seconds to tens of seconds).

Also, the used CNTs may be single walled carbon nanotubes (SWNTs) having a diameter of 4 to 5 nm and a length of 500 to 1500 nm, and the solution may be dichlorobenzene in which the SWNTs are dispersed at a concentration of 0.02 to 0.2 mg/ml.

Meanwhile, the oxygen plasma treatment may be performed for 5 to 30 seconds.

According to another aspect of the present invention, there is provided a method of fabricating a CNT device. The method includes: forming an insulating layer on a substrate; forming a mask pattern on the insulating layer; adsorbing more CNT particles than a reference value onto an open area of the mask pattern; and removing adsorbed CNTs by performing an oxygen plasma treatment on the adsorbed CNT particles, so that the reference value of CNT particles are adsorbed and used in the device.

Preferably, the method may further include forming an electrode to use the CNT particles as an active layer.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1:
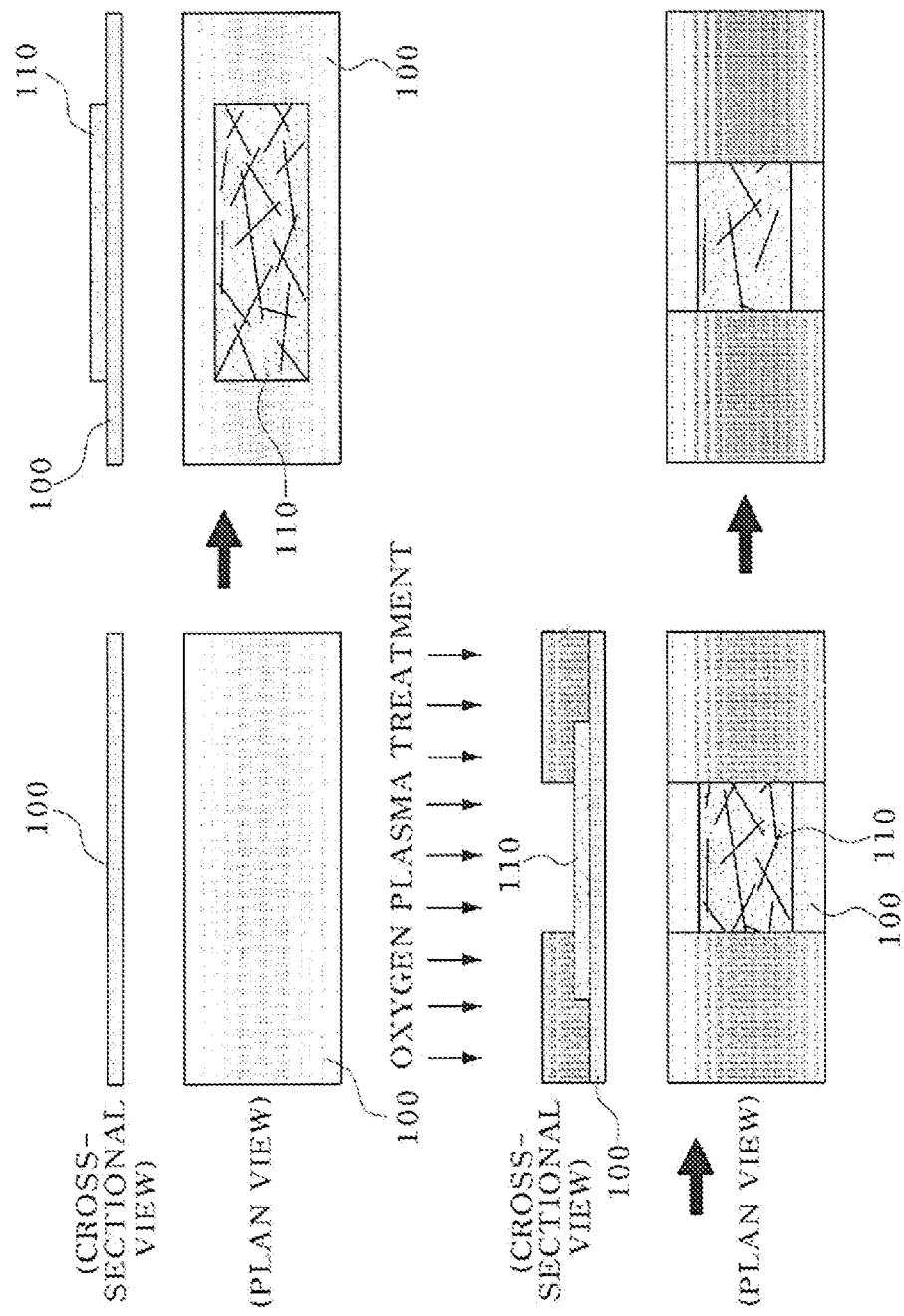
FIG. 1 is a conceptual diagram illustrating a method of controlling an amount of carbon nanotubes (CNTs) according to an exemplary embodiment of the present invention.

FIG. 1 is a conceptual diagram illustrating a method of controlling an amount of adsorbed carbon nanotubes (CNTs) by removing some of adsorbed CNTs according to an exemplary embodiment of the present invention. FIG. 1 separately shows cross-sectional views and plan views in a fabrication process of a CNT device.

Referring to FIG. 1, the method of controlling an amount of CNTs according to an exemplary embodiment of the present invention includes adsorbing CNT particles 110 onto a semiconductor structure 100, and removing some of the adsorbed CNTs by performing an oxygen plasma treatment on the adsorbed CNT particles 110.

As a method of adsorbing the CNT particles onto the semiconductor structure 100, a method of immersing the semiconductor structure 100 in a solution of dichlorobenzene in which CNTs are dispersed for a predetermined time (tens of seconds) to have CNTs adsorbed on a surface, etc. of the semiconductor structure 100 may be used.

Figure 2:
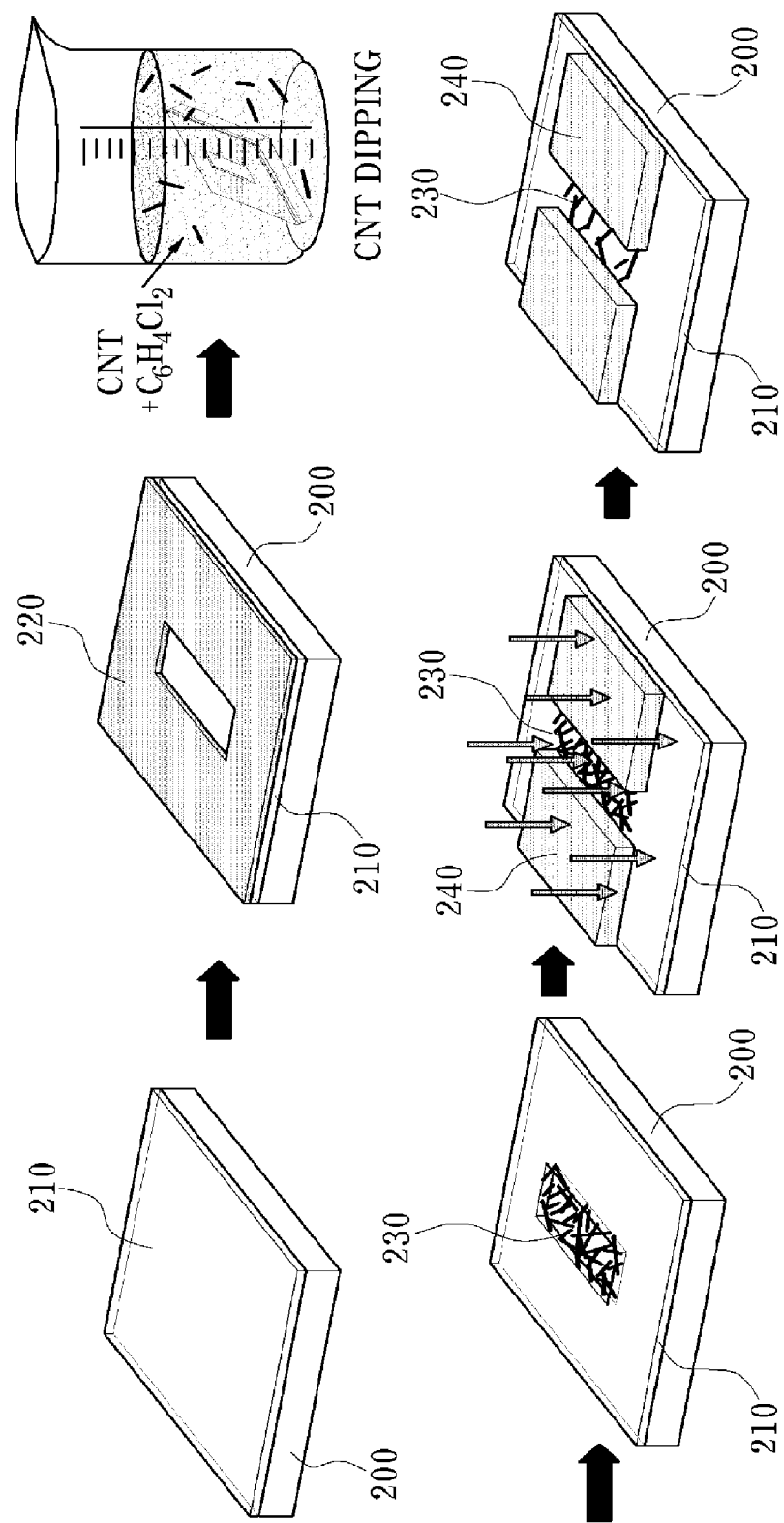
FIG. 2 is a flowchart illustrating a method of fabricating a CNT device according to an exemplary embodiment of the present invention.

FIG. 2 is a flowchart illustrating a method of fabricating a CNT device according to an exemplary embodiment of the present invention.

As illustrated in FIG. 2, the method of fabricating a CNT device according to an exemplary embodiment of the present invention includes a step of preparing a silicon substrate 200 on which an insulating layer 210 is grown, an organic cleaning step of removing organic matters generated on a surface of the prepared substrate 200, a spin coating step of applying photoresist (PR) to the surface of the substrate 200, a step of baking the substrate 200 to which PR has been applied, a step of radiating ultraviolet (UV) light onto the substrate 200 using a mask aligner, a step of forming a PR pattern 220 in a desired shape by developing the substrate 200 irradiated by UV light using a developing solution, a step of immersing the substrate 200 on which the PR pattern 220 has been formed in a solution of dichlorobenzene in which CNTs 230 are dispersed for a predetermined time, a step of baking the surface of the substrate 200, and a step of removing the PR pattern 220 from the substrate 200. Subsequently, source and drain electrodes 240 of the CNT device are formed. Although FIG. 2 illustrates the doped silicon substrate 200 on which the insulating layer 210 is grown as an example, an undoped silicon substrate can be used without an insulating layer in actual application.

The above-mentioned process of fabricating a CNT device will be described in detail below.

First, an insulating layer 210 is formed on a substrate 200. The substrate 200 may be a silicon wafer. The insulating layer 210 may be an oxide layer having a thickness of 120 nm to 300 nm. The oxide layer may be formed by growing a thermal oxide layer using a furnace at 1000° C. or more, or depositing a thin $SiO_2$ layer on the substrate 200 using plasma-enhanced chemical vapor deposition (PECVD) or low-pressure chemical vapor deposition (LPCVD), or may be spin-coated using silica on-glass (SOG).

Subsequently, a mask pattern 220 is formed on the insulating layer 210. PR can be used as the mask pattern 220, and the arbitrary PR pattern 220 is formed on the insulating layer 210 through a photolithography process. A line width of the PR may vary between 1 μm and 10 μm.

Meanwhile, a PR baking process of baking the substrate 200 to which the PR has been applied may be further included. Using a hot plate, the substrate 200 is baked at 85° C. for 20 seconds. PR used in a spin-coating step in which the PR is applied on a surface of the substrate 200 may be AZ5206 or AZ5214 PR from Clariant Corp.

Subsequently, in a step of adsorbing CNT particles onto surfaces of the materials through a solution process, all CNT particles are adsorbed in areas of the PR pattern 220 and the insulating layer 210. Here, the amount of adsorbed CNT particles is varied according to the degree of hydrophilicity of each surface. Thus, it is possible to control an amount of CNT particles adsorbed on the surface of the insulating layer 210 through surface modification of the insulating layer ($SiO_2$) 210.

More preferably, an amount of CNT particles is controlled by removing some adsorbed CNT particles through an oxygen plasma treatment. In this method, more CNT particles than a reference value are adsorbed, and then some of the adsorbed CNT particles are removed by performing an oxygen plasma treatment on the adsorbed CNT particles, so that the reference value of CNT particles can be used in the device. Compared to controlling the amount of adsorbed CNT material, removing some adsorbed CNT particles to reduce an amount of adsorbed CNT particles ensures a more stable and reliable process.

Also, when the oxygen plasma treatment is performed while a resistance value or current value between source and drain electrodes is monitored in real time, an amount of adsorbed CNT particles can be accurately and minutely controlled. For example, when the resistance value or current value falls within a range of the resistance value or current value set in advance while the oxygen plasma treatment is performed, the oxygen plasma treatment is stopped by automation control or a user, so that a stable and reliable process can be ensured. In other words, since it is not easy to control an amount of adsorbed CNT material, an amount of adsorbed CNTs is eventually controlled through removal of CNTs according to an exemplary embodiment of the present invention, so that the stability of the process can be ensured.

Alternatively, current values or resistance values may be stored in advance as a database according to a plasma treatment time. In other words, a resistance value or current value is measured and stored as a database before and after each plasma treatment. Thus, the database stores information about how much the original resistance value or current value is lowered according to a plasma treatment time. When the database is used, an amount of adsorbed CNT particles can be accurately and minutely controlled by adjusting a plasma treatment time only.

Describing in detail the step of adsorbing CNT particles onto surfaces of the materials through a solution process, the substrate 200 is immersed in a solution of dichlorobenzene in which CNT particles are dispersed for a predetermined time. Here, the used CNTs have a diameter of 4 to 5 nm and a length of 500 to 1500 nm, and the solution is dichlorobenzene in which CNTs are dispersed at a concentration of 0.02 to 0.2 mg/ml.

Subsequently, the PR pattern 220 on the surface of the substrate 200 on which CNT particles have been adsorbed is removed. When the PR pattern 220 on the surface of the substrate 200 is removed using acetone or a PR striper, CNT particles of an area in which the PR pattern 220 has been present are removed, and the surface of the insulating layer 210 is exposed. Through this process, CNTs adsorbed on a PR surface are removed, and CNTs adsorbed on the surface of the substrate 200 remain, so that a pattern is formed of CNT material on the substrate surface.

Thereafter, an oxygen plasma treatment process is performed. In this step, a post process is performed so that a sensor can be used as a chemical sensor, that is, can be within an optimized sensitivity range. Some CNTs are thereby burned to optimize an amount of CNTs.

For example, when the CNT device is used as a chemical sensor, an oxygen plasma post-processing process (100 W, 300 mTorr) is performed so that the CNT device can be within an optimized sensitivity range ($I_{SD}$: <1 μA@$V_{SD}$=0.5 V). A part of a CNT network is thereby burned to optimize an amount of CNTs.

Figure 3:
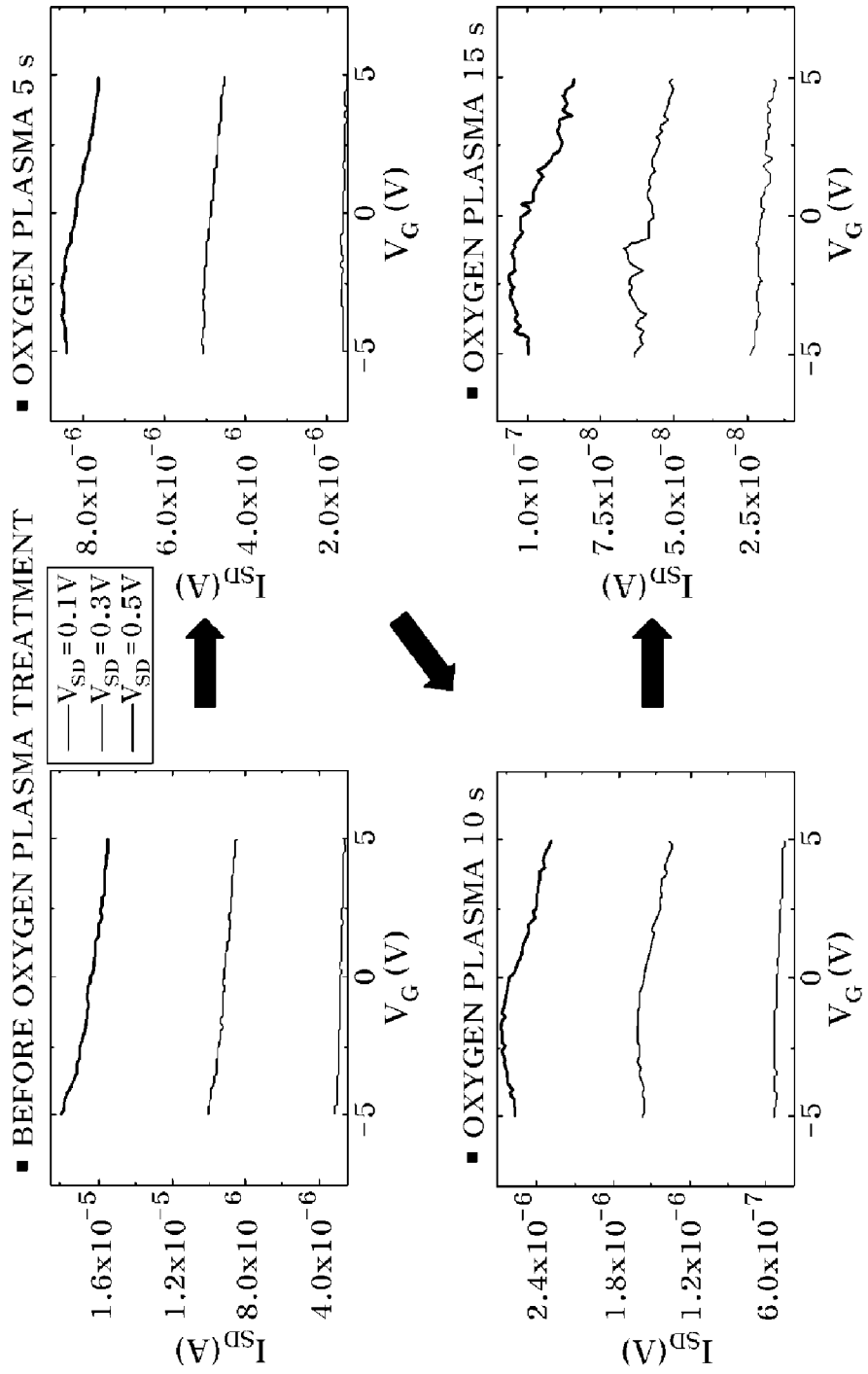
FIG. 3 shows graphs of current between source and drain electrodes of a CNT electronic device fabricated through an oxygen plasma process versus voltage applied to a gate electrode before an oxygen plasma treatment and 5, 10 and 15 seconds after oxygen plasma is applied.

FIG. 3 shows graphs of current between source and drain electrodes of a CNT field effect transistor (FET) fabricated through an oxygen plasma process versus voltage applied to a gate electrode before an oxygen plasma treatment and at oxygen plasma application times of 5, 10 and 15 seconds.

If $V_G$ sweeps from −5 V to 5 V when $V_{SD}$ is 0.1 V, 0.3 V, and 0.5 V at oxygen plasma application times of 0 s, 5 s, 10 s, and 15 s, a current $I_{SD}$ between the source and drain electrodes of the FET is high before the oxygen plasma treatment but is reduced as oxygen plasma application time increases.

For example, if $V_G$ is 0 V and $V_{SD}$ is 0.5 V, the current $I_{SD}$ is about $1.6 \times 10^{-5}$ A at an oxygen plasma application time of 0 s, about $8.0 \times 10^{-6}$ A at an oxygen plasma application time of 5 s, about $2.4 \times 10^{-6}$ A at an oxygen plasma application time of 10 s, and about $1.0 \times 10^{-7}$ A at an oxygen plasma application time of 15 s. It can be seen that $I_{SD}$ is remarkably reduced as oxygen plasma application time increases.

On the basis of such a characteristic, more CNT particles than a reference value are adsorbed when CNTs are actually adsorbed, and an oxygen plasma treatment is performed on the adsorbed CNT particles after a device is fabricated, so that the reference value of CNT particles can be used in the device. In this case, when the oxygen plasma treatment of the fabricated device is performed, $I_{SD}$ may be checked in real time to adjust the application time.

In other words, after current characteristics of CNT devices are stored as a database according to widths and lengths of the devices and various conditions (pressure, time, power, etc.) of an oxygen plasma treatment and then characteristics of a CNT electronic device fabricated on the basis of the database are measured, the characteristics of the CNT electronic device can be properly varied. While it is actually not easy to control an amount of adsorbed CNTs in a fabrication process of a CNT electronic device, the above-described method facilitates control of an amount of adsorbed CNTs through a post process.

Figure 4:
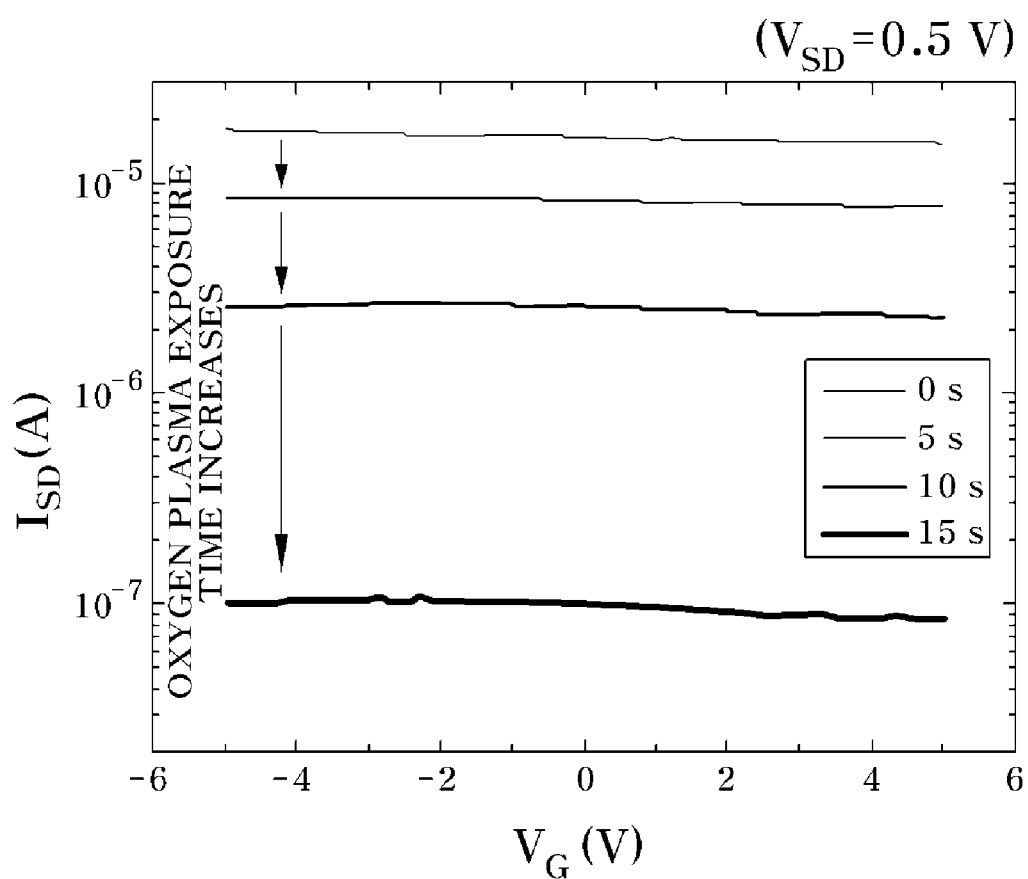
FIG. 4 shows a graph of current between source and drain electrodes of a CNT electronic device fabricated through an oxygen plasma process versus voltage applied to a gate electrode at a constant voltage (0.5 V) between the source and drain electrodes before an oxygen plasma treatment and 5, 10 and 15 seconds after oxygen plasma is applied.

FIG. 4 shows a graph of current between source and drain electrodes of a CNT electronic device fabricated through an oxygen plasma process versus voltage applied to a gate electrode at a constant source-drain voltage ($V_{SD}$=0.5 V) before an oxygen plasma treatment and at oxygen plasma application times of 5, 10 and 15 seconds.

As oxygen plasma exposure time increases, some CNT particles are removed, and the overall resistance of an active layer of CNTs increases. By a 15-second oxygen plasma treatment, the source-drain current is reduced from $2\times10^{-5}$ A to $1\times10^{-7}$ A, so that the CNT electronic device can be used in a chemical sensor.

Using an exemplary embodiment of the present invention, it is possible to solve a problem that amounts of adsorbed CNTs are not uniform in CNT devices fabricated using CNTs.

Exemplary embodiments of the present invention enable mass production of a large-area device having excellent performance and reproducibility at a low cost thus having great industrial applicability.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of controlling an amount of adsorbed carbon nanotube (CNTs), comprising:
   adsorbing CNT particles onto a semiconductor structure by immersing a substrate in a solution of dichlorobenzene in which CNTs are dispersed; and
   removing some of the adsorbed CNT particles by performing an oxygen plasma treatment on the adsorbed CNT particles,
   wherein a photoresist (PR) pattern is formed on the substrate that is immersed in the solution of dichlorobenzene, and the substrate is immersed in the solution of dichlorobenzene for a predetermined time.

2. The method of claim 1, wherein the used CNTs are CNTs having a diameter of 4 to 5 nm and a length of 500 to 1500 nm, and
   the solution is dichlorobenzene in which the CNTs are dispersed at a concentration of 0.02 to 0.2 mg/ml.

3. The method of claim 1, wherein, in the plasma treatment, a change in an electrical property according to a plasma treatment time is stored as a database in advance, and an oxygen plasma treatment time is adjusted on the basis of the database to control the amount of adsorbed CNT particles on the semiconductor structure.

4. A method of controlling an amount of adsorbed carbon nanotubes (CNTs), comprising:
   adsorbing CNT particles onto a semiconductor structure; and
   removing some of the adsorbed CNT particles by performing an oxygen plasma treatment on the adsorbed CNT particles,
   wherein the oxygen plasma treatment is performed while a resistance value or current value of the adsorbed CNT particles is automatically or manually monitored.

5. A method of fabricating a carbon nanotube (CNT) device, comprising:
   forming an insulating layer on a substrate;
   forming a mask pattern on the insulating layer;
   adsorbing CNT particles onto an open area of the mask pattern; and
   removing some of the adsorbed CNT particles by performing an oxygen plasma treatment on the adsorbed CNT particles, in order to reduce an amount of CNT particles in the device,
   wherein the oxygen plasma treatment is performed while a resistance or current of the adsorbed CNT particles is automatically or manually monitored.

6. The method of claim 5, further comprising forming an electrode to use the CNT particles as an active layer.

7. The method of claim 6, wherein the oxygen plasma treatment is performed while the resistance or current of the adsorbed CNT particles is automatically or manually monitored using the electrode.

8. The method of claim 5, wherein, in the plasma treatment, a change in an electrical property according to a plasma treatment time is stored as a database in advance, and an oxygen plasma treatment time is adjusted on the basis of the database to control an amount of the adsorbed CNT particles.

9. The method of claim 5, wherein the oxygen plasma treatment is performed while the resistance or current of the adsorbed CNT particles is automatically or manually monitored.

10. A method of controlling an amount of adsorbed carbon nanotubes (CNTs), comprising:
    adsorbing CNT articles onto a semiconductor structure by exposing a substrate to a solution of dichlorobenzene in which CNTs are dispersed;
    removing a portion of the adsorbed CNT particles to control an amount of CNTs disposed on the substrate; and
    forming a photoresist (PR) pattern on the substrate before exposing the substrate to the solution of dichlorobenzene in which CNTs are dispersed.

11. A method of controlling an amount of adsorbed carbon nanotubes (CNTs), comprising:
    adsorbing CNT particles onto a semiconductor structure by exposing a substrate to a solution of dichlorobenzene in which CNTs are dispersed;
    removing a portion of the adsorbed CNT particles to control an amount of CNTs disposed on the substrate,
    wherein the removing of a portion of the adsorbed CNT particles is performed by an oxygen plasma treatment, and
    wherein a resistance value or current value of the adsorbed CNT particles is automatically or manually monitored during the oxygen plasma treatment.

12. A method of controlling an amount of adsorbed carbon nanotubes (CNTs), comprising:
    adsorbing CNT particles onto a semiconductor structure by exposing a substrate to a solution of dichlorobenzene in which CNTs are dispersed;
    removing a portion of the adsorbed CNT particles to control an amount of CNTs disposed on the substrate,
    wherein the removing of a portion of the adsorbed CNT particles is performed by an oxygen plasma treatment, and
    wherein, in the plasma treatment, a change in an electrical property according to a plasma treatment time is stored as a database in advance, and an oxygen plasma treatment time is adjusted on the basis of the database to control the amount of the adsorbed CNT particles.

* * * * *